United States Patent [19]
Yen

[11] Patent Number: 5,332,604
[45] Date of Patent: Jul. 26, 1994

[54] ADHESIVE SYSTEM FOR REDUCING THE LIKELIHOOD OF PARTICULATE

[76] Inventor: Yung-Tsai Yen, 196 Tuscaloosa Ave., Atherton, Calif. 94025

[21] Appl. No.: 41,500

[22] Filed: Apr. 1, 1993

[51] Int. Cl.$^5$ .............................................. B32B 3/08
[52] U.S. Cl. ...................................... 428/14; 355/122
[58] Field of Search ........................... 428/14; 355/122

[56] References Cited

U.S. PATENT DOCUMENTS

| | | | |
|---|---|---|---|
| 3,500,129 | 3/1970 | Jowitt | 132/88.7 |
| 3,615,006 | 10/1971 | Freed | 206/62 R |
| 3,645,281 | 2/1972 | Seidler | 206/62 R |
| 3,765,941 | 10/1973 | Gordon | 134/6 |
| 4,252,846 | 2/1981 | Romesberg et al. | 428/35 |
| 4,343,964 | 8/1982 | Wootton | 174/10 |
| 4,470,508 | 9/1984 | Yen | 206/334 |

*Primary Examiner*—Alexander S. Thomas
*Attorney, Agent, or Firm*—Kolisch, Hartwell, Dickinson, McCormack & Heuser

[57] ABSTRACT

A system for reducing the generation of particulate in the use of an optical pellicle is disclosed. The system is designed for use with a pellicle having a pellicle membrane with an underside and an upper side, and a pellicle frame having inner, outer, top and bottom sides. The underside of the pellicle membrane is tensed over and bonded to the top of the pellicle frame. A first adhesive layer coating is applied to the inner side of the pellicle frame and extends continuously over the top of the pellicle frame. This reduces the likelihood of a generation of particulate as a result of improper formation of the adhesive layer, or as a result of degradation of the adhesive layer over time. It is normal that this first adhesive layer cover substantially all of the inner and outer surfaces of the pellicle frame. In one embodiment of the present invention, the first adhesive layer also extends continuously across the underside of the pellicle membrane.

9 Claims, 1 Drawing Sheet

5,332,604

ADHESIVE SYSTEM FOR REDUCING THE LIKELIHOOD OF PARTICULATE

BACKGROUND OF THE INVENTION

The present invention relates to pellicles that are used in the semi-conductor chip industry, and more particularly to an adhesive system for reducing the likelihood of particulate.

In the semi-conductor chip industry it is well known that pattern transfer from the photomask to substrate is accomplished by exposing a mask to a light source. During the pattern transfer process, also called the photolithographic process, patterns on the photomask are projected onto the substrate which has been treated with a photosensitive substance. This results in the mask etchings being reproduced onto the substrate. Unfortunately, any foreign substance on the surface of the mask will also be reproduced on the substrate and therefore will interfere with proper pattern transfer to the substrate.

To eliminate contamination of the mask surface, a framed, thin membrane known as a pellicle is mounted on the mask surface, such that the pellicle membrane extends parallel to the mask at a predetermined distance spaced away from it. Any contamination which would ordinarily land on the mask surface instead falls onto the pellicle membrane.

Pellicles substantially eliminate the above problem because contamination on the pellicle membrane will not be projected onto the substrate. The frame of the pellicle supports the membrane at a distance spaced away from the mask surface so any particles or other contaminants on the pellicle membrane will be out of focus during pattern transfer.

The use of pellicles can increase the quality of the resulting circuit, thereby dramatically improving circuit fabrication productivity. Consequently, it is no surprise that pellicle manufacturing techniques have become increasingly important because high quality pellicles are critical to the success of the photolithographic process.

During the pellicle manufacturing process, it is important to minimize the possibility of either relatively large or small contaminant particles being deposited on the pellicle membrane. Relatively large particles are unacceptable because they may be reproduced in the substrate during photolithography even though they are out of focus. Equally unacceptable are particles (whether large or small) that are deposited on the underside of the pellicle membrane or the pellicle frame. Such particles may drop onto the mask surface during photolithography which is precisely what is to be avoided by using pellicles.

It is also critical that the pellicle membrane be extremely uniform across its surface. This is so that the light passing through the membrane during lithography is unobstructed and is not in any way refracted. Thus, the composition of the membrane must be highly uniform, and the membrane must be evenly tensioned across the pellicle frame. Also, it is important to ensure that a continuous seal exists between the thin film and the frame.

To further understand these important requirements, it is necessary to provide an explanation as to how pellicles are formed.

As is known in the art, forming an optical membrane is the first step in pellicle manufacture. Commonly the membrane is prepared by spinning a suitable polymer, such as nitrocellulose or a nitrocellulose-containing polymer, on a substrate. The newly formed membrane is then removed from the substrate and held under tension, adjacent its periphery, to prepare it for subsequent manufacturing steps.

Next, a frame is fastened, or bonded, to a working area of the membrane, framing the working area. After fastening, the frame and the working area of the membrane attached to it are ready to be separated from the remaining area of the membrane.

As suggested above, it is particularly critical that no particulate be generated by the underside of the membrane and the inner sides of the pellicle frame. This is because any particulate that falls from these surfaces will fall directly onto the photomask, and during photolithography is likely to be reproduced on the wafer substrate. One problem which exists with some of the prior art designs is that various adhesive surfaces terminate at edges or at surfaces which may result in the generation of particulate at such edges or abutting surfaces.

It is therefore an object of the present invention to develop a pellicle system which will be far less likely to generate particulates in the region defined between the underside of the pellicle membrane and the inner side of the pellicle frame. An additional object of the present invention is to develop such a system which is relatively simple and therefore inexpensive to fabricate, and which does not have a deleterious effect upon the performance of the pellicle. As noted above, it is critical that pellicle membrane transmissivity and uniformity be substantial, so it is important that the objects of this invention be achieved without adversely affecting the performance of the pellicle.

SUMMARY OF THE INVENTION

One aspect of the invention comprises an adhesive layer which is designed to be used in conjunction with a pellicle having a pellicle membrane with an underside and an upper side and a pellicle frame with inner, outer, top and bottom sides. The underside of the pellicle membrane is tensed over and bonded to the top of the pellicle frame. A first adhesive layer coating is provided on the inner side of the pellicle frame, and which continuously extends over the top of the pellicle frame. In one form of the invention a second adhesive layer is disposed between the underside of the pellicle membrane and the upper side of the pellicle frame for causing the membrane to adhere to the frame. Normally the second adhesive layer is disposed between the membrane and the first adhesive layer. It is also normal that the first adhesive layer cover substantially all of the inner and upper surfaces of the pellicle frame.

In one variation of the invention, the first adhesive layer also extends continuously across the underside of the pellicle membrane. If this configuration is utilized, it is, of course, important that this first adhesive layer not have an adverse effect upon transmissivity and uniformity of the pellicle membrane.

Various other objects and advantages of the present invention will become more fully apparent as this description continues.

BRIEF DESCRIPTION OF THE DRAWINGS

FIG. 3 also extends the coating along the underside of the pellicle membrane.

DETAILED DESCRIPTION OF THE PREFERRED EMBODIMENTS

Figure 3:
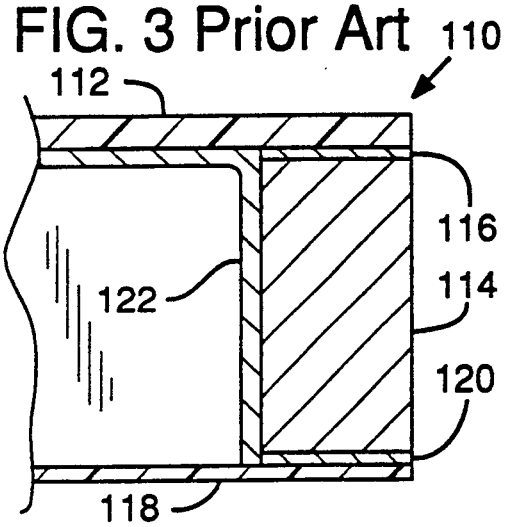
Figure 4:
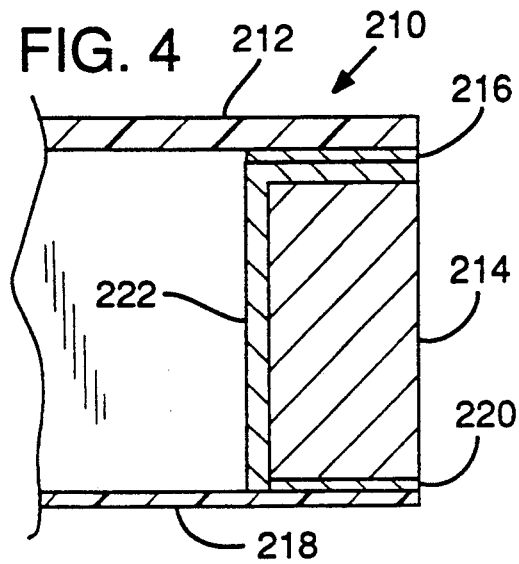
FIG. 4 is a view which corresponds to that of FIGS. 2 and 3 except showing a first embodiment of the present invention.
Figure 5:
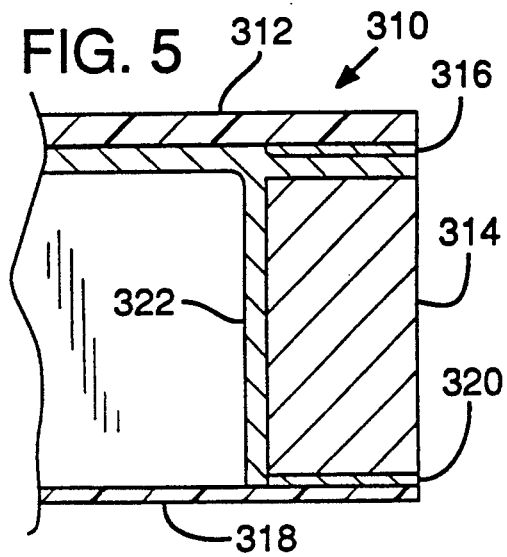
FIG. 5 is a view which corresponds to that of FIGS. 2 and 3 except showing a second embodiment of the present invention.

The two preferred embodiments of the present invention have been schematically depicted in FIGS. 4 and 5. However, before reference is made to those figures, the prior art systems depicted in FIGS. 1-3 will first be described.

Figure 1:
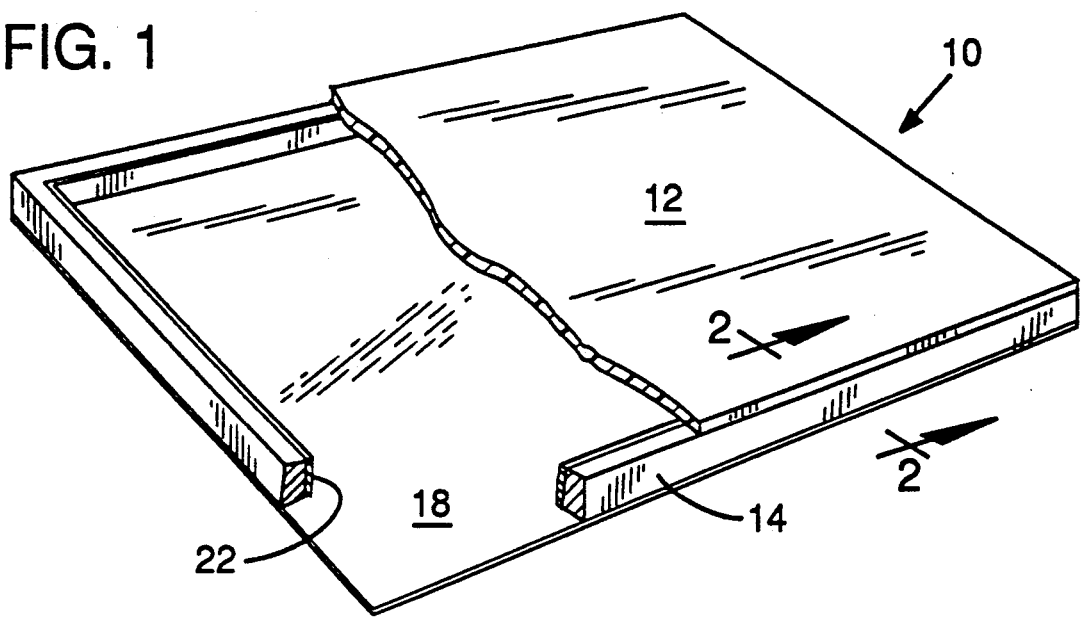
FIG. 1 is an isometric, sectional view of a conventional pellicle with which the present invention may be utilized. The adhesive coatings depicted in this figure are prior art coatings.

FIG. 1 depicts a conventional optical pellicle 10 which is used as a dust cover on photolithography applications as described above. As will be understood by those in the art, pellicle 10 is designed to be placed directly onto a photomask (not shown) to prevent dust from falling onto the surface of the photomask. Instead, dust or other particulate will fall on the pellicle membrane 12 which is mounted to a pellicle frame 14 which holds the pellicle membrane 12 at a distance spaced from the surface of the photomask. Therefore, any dust and other small particulate dropping onto the upper surface of pellicle membrane 12 will be out of focus in the photolithography operation and will therefore not normally be reproduced in the silicon wafer (not shown) positioned a predetermined distance below the photomask (not shown).

Figure 2:
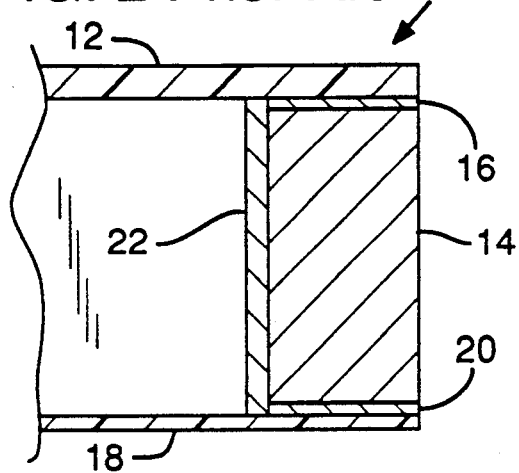
FIG. 2 and FIG. 3 are two prior art configurations of coatings, with both figures showing a coating covering substantially all of the inner side of the pellicle frame.

As is shown in FIG. 1, the pellicle membrane 12 is typically tensioned over the pellicle frame 14 in the configuration of a window which is positioned over the operative portion of the photomask. The membrane 12 is mounted to the frame 14 through the use of conventional epoxy or a UV cured adhesive such as Norland Optical Adhesive No. 81, marketed by Norland Products Inc. Alternatively, Norland 65 or 61 adhesive, or other similar adhesives, may be utilized. While this membrane mounting adhesive layer is not shown in FIG. 1, it is depicted at 16 in FIG. 2 and at 116 in FIG. 3. A protective membrane 18 is shown in FIG. 1, and is also depicted in FIG. 2 at 18 and in FIG. 3 at 118. This protective membrane 18, 118 is removably mounted to the underside of the pellicle frame 14 at a position spaced from the pellicle membrane 12. This protective membrane is mounted to the pellicle frame immediately after fabrication of the pellicle 10, but prior to packaging. In order for the pellicle to be used, the protective membrane 18 must be removed. The protective membrane is mounted to the pellicle frame by a protective membrane adhesive layer which is not shown in FIG. 1, but which appears at 20 in FIG. 2 and at 120 in FIG. 3. Because the protective membrane 18 is removably mounted to the pellicle frame 14, the adhesive layer 20, 120 is normally different from that of adhesive layer 16, 116, and is normally in the form of an acrylic adhesive such as 3M 966, marketed by Minnesota Mining and Manufacturing Co. When the pellicle is to be used, the protective membrane 18 is removed, and the pellicle is pressed directly onto the photomask, such that the protective membrane mounting adhesive layer 20, 120 removably bonds the pellicle to the photomask (which, again, is not shown in the drawings).

Because it is of critical importance in photolithography operations that particulate not fall from the underside of the pellicle membrane 12, or from the inner sides of the pellicle frame 14, in certain applications a first adhesive layer is applied to the inner side of the pellicle frame so that any dust or other particulate will adhere to that adhesive, rather than falling onto the photomask. This first adhesive layer is depicted at 22 in FIGS. 1 and 2 and at 122 in FIG. 3. In FIG. 3, this first adhesive layer 122 also extends across the underside of the pellicle membrane 112. In that instance, it is critical that this first adhesive layer 122 be sufficiently uniform and transparent that it will not have an adverse effect upon the performance of the pellicle. Of course, any reflection or refraction of the light as it passes through the pellicle membrane on its way to the photomask would affect the corresponding pattern etched in the silicon wafer positioned below the photomask.

While the use of these first adhesive layers 22 and 122 has tended to reduce the amount of particulate which might fall onto the photomask, in certain applications the use of such an adhesive layer can have a serious drawback. If, for example, the adhesive layer 22, 122 has not been formed properly at the point where it meets the pellicle membrane 12 in FIG. 2, or where it passes over the corner between the pellicle frame 114 and the pellicle membrane 112 in FIG. 3, it is possible that particulate might actually be generated by a breakdown of this first adhesive layer 22, 122. This generation of particulate can actually result in additional particulate falling onto the photomask. As mentioned above, the present invention has, as an object, the reduction or elimination of such particulate.

FIGS. 4 and 5 depict two preferred embodiments of the present invention. Because most of the components correspond to the embodiments shown in FIGS. 1-3, corresponding numerals have been used, except that they are in the 200 and 300 series. Thus, the pellicle in FIG. 4 is identified at 210, while that pellicle is identified at 310 in FIG. 5. The pellicle membrane is identified at 212 in FIG. 4 and 312 in FIG. 5, the pellicle frame 214 and 314, the membrane mounting adhesive layer 216 and 316, the protective membrane 218 and 318, the protective member mounting adhesive layer 220 and 320, and the first adhesive layer 222 and 322.

With regard to the first adhesive layer 222 in FIG. 4, it can be seen that this layer covers substantially all of the inner surface of the pellicle frame 214, and then passes over the pellicle frame to cover substantially all of the upper surface of that frame as well. Thus, unlike the prior art unit depicted in FIG. 2, there is no abrupt interface between the first adhesive layer 22 and the underside of the pellicle membrane 12, at which interface particulate might be generated by the degradation, over time, of that first adhesive layer.

The embodiment of FIG. 5 is identical to that of FIG. 4 except that it shows the first adhesive layer 322 extending across the underside of the pellicle membrane 312. Like the embodiment of FIG. 4, the first adhesive layer 322 also extends continuously over the upper surface of the pellicle frame 314. Thus, there is no abrupt interface exposing an edge of the first adhesive layer, which might permit the generation of particulate. In comparing the prior art configurations in FIGS. 2 and 3, it can be seen that there is no corresponding interface between the first adhesive layer 122 in FIG. 3, such as there is in first adhesive layer 22 in FIG. 2. However, it is possible that the formation of the first adhesive layer 122 may be less than perfect at the joint between the pellicle membrane 112 and the pellicle frame 114, such that particulate might be generated at that point. Because of the mass of adhesive at that point in the first adhesive layer 322 of FIG. 5, there is less likelihood of an imperfect formation of the layer, and therefore less likelihood of generation of particulate. This is as a result of the continuous formation of the first adhesive layer which extends from the inner surface of the pellicle frame 314 and across the top surface of the pellicle frame, in a continuous fashion. The adhesive layers 222 and 322 typically take the form of an acrylic emulsion adhesive such as Uniroyal M 6197, although other suitable adhesives might alternatively be used.

It is possible that in certain applications, the configuration of the first adhesive layer will be different from that depicted in FIGS. 4 and 5. Such similar configurations are, however, intended to be encompassed by the present invention and will be appreciated by those with ordinary skill in the art. Other variations and modifications of the present invention may also be possible without departing from the spirit and scope of the present invention.

It is claimed and desired to secure by Letters Patent:

1. In a pellicle having a pellicle membrane with an underside and an upper side and a pellicle frame having inner, outer, top and bottom sides, with the underside of the pellicle membrane tensed and extending over the top of the pellicle frame, an adhesive layer comprising:
   a first adhesive layer comprised of a single adhesive applied to the inner side of the pellicle frame and continuously extending over the top of the pellicle frame between the pellicle membrane and the top of the pellicle frame, such that there is no abrupt interface in the first adhesive layer which is adjacent the underside of the pellicle member.

2. The adhesive layer of claim 1, further comprising a second adhesive layer disposed between the underside of the pellicle membrane and the upper side of the pellicle frame, for adhering the membrane to the frame.

3. The adhesive layer of claim 2 wherein the second adhesive layer is disposed between the membrane and the first adhesive layer.

4. The adhesive layer of claim 1 wherein the first adhesive layer covers substantially all of the inner and upper surfaces of the pellicle frame.

5. The adhesive layer of claim 1 wherein the first adhesive layer also extends continuously across the underside of the pellicle membrane.

6. In a pellicle having a pellicle membrane with an underside and a pellicle frame having inner and top sides, with the underside of the pellicle membrane tensed over and bonded to the top side of the pellicle frame, an adhesive layer comprising:
   a first adhesive layer coating applied to the inner side of the pellicle frame and continuously extending over the top of the pellicle frame; and
   a second adhesive layer coating applied to the first adhesive layer coating and contacting the underside of the pellicle membrane such that the pellicle membrane and the top side of the frame are separated by the two adhesive layers.

7. The adhesive layer of claim 6 wherein the first adhesive layer also extends continuously across the underside of the pellicle membrane.

8. In a pellicle having a pellicle membrane with an underside and a pellicle frame having inner and top sides, with the underside of the pellicle membrane tensed over and bonded to the top side of the pellicle frame, and adhesive layer comprising:
   a first adhesive layer coating applied to the inner side of the pellicle frame and continuously extending over the top of the pellicle frame; and
   a second adhesive layer coating located between the underside of the pellicle membrane and the top side of the pellicle frame such that the pellicle membrane is bonded to the top side of the pellicle frame and such that the second adhesive layer coating does not contact the pellicle frame.

9. The adhesive layer of claim 8 wherein the first adhesive layer further extends along the underside of the pellicle membrane in a continuous formation such that there is no abrupt interface in the first adhesive layer adjacent the underside of the pellicle membrane.

* * * * *